Feb. 26, 1957 C. J. FOWLER 2,783,373
SUPERHETERODYNE RECEIVER USING RESISTANCE-CAPACITANCE TUNING IN LOCAL OSCILLATOR AND RADIO FREQUENCY STAGE
Filed Oct. 5, 1953
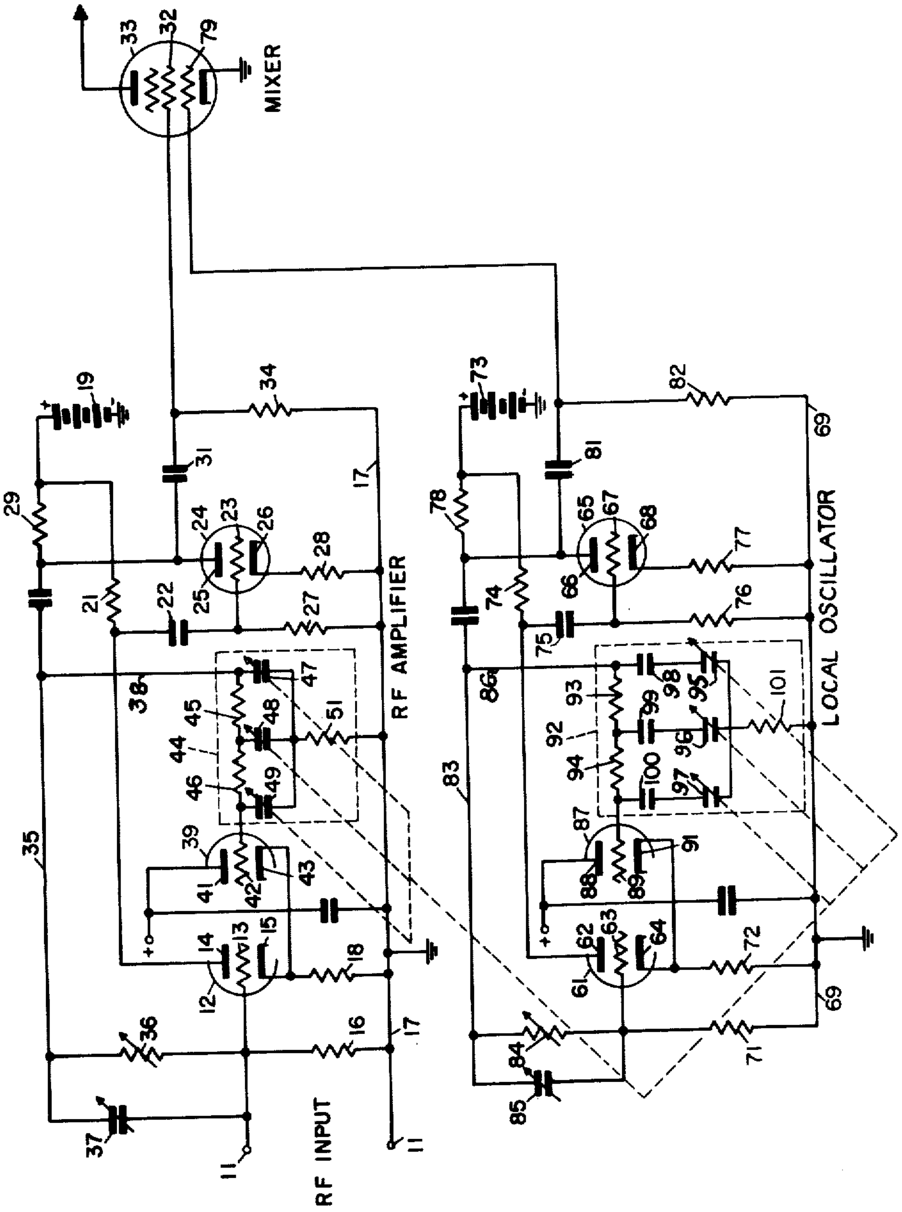
INVENTOR
CONRAD J. FOWLER
BY George Sipkin
H. H. Hentzen
ATTORNEYS

United States Patent Office 2,783,373
Patented Feb. 26, 1957

2,783,373

SUPERHETERODYNE RECEIVER USING RESISTANCE-CAPACITANCE TUNING IN LOCAL OSCILLATOR AND RADIO FREQUENCY STAGE

Conrad J. Fowler, Wyndmoor, Pa., assignor, by mesne assignments, to the United States of America as represented by the Secretary of the Navy

Application October 5, 1953, Serial No. 384,361

8 Claims. (Cl. 250—20)

This invention relates to superheterodyne radio receivers and more particularly to radio receivers having resistance-capacitance tuned radio frequency amplifiers and resistance-capacitance tuned local oscillators.

In the past, radio receivers have utilized tuning circuits comprising both inductance and capacitance. Since the frequencies for which such circuits were tuned varied with the square root of the impedance of the tuning members, accurate and uniform tracking was difficult. In addition, shielding of the inductors was necessary to prevent unwanted feedback due to the interaction of their magnetic fields. These receivers were also fragile because of the fine wire of the inductors which was subject to breakage.

It is an object of this invention to provide new and improved superheterodyne radio receiver circuits.

It is another object of this invention to provide superheterodyne radio receiver circuits which require no inductors.

It is a further object of this invention to provide new superheterodyne radio receiver circuits in which tracking among tuned components is accurate and uniform.

Other objects and advantages of the invention will hereinafter become more fully apparent from the following description of the annexed drawings, which illustrate a preferred embodiment, and wherein the single figure of the drawing is a circuit diagram of the circuit of the invention.

Referring to the drawing, the reference numerals 11 designate input terminals, one of which is grounded, for connecting radio frequency signals into a radio frequency amplifier. A triode 12 comprising a control grid 13, an anode 14 and a cathode 15 provides a first stage of radio frequency amplification. The control grid 13 is connected to the ungrounded terminal 11 and receives energy therefrom. The control grid 13 and the cathode 15 are connected to a ground wire 17 by resistors 16 and 18 respectively. The anode 14 receives energy from a battery 19 through an anode load resistor 21 and is connected through a capacitor 22 to a control grid 23 of a triode 24 which also comprises an anode 25 and a cathode 26. The control grid 23 and the cathode 26 are connected to the ground wire 17 by resistors 27 and 28 respectively. The anode 25 receives energy from the battery 19 through an anode load resistor 29 and is connected through a capacitor 31 to a screen grid 32 of a pentode mixer 33. The screen grid 32 is connected to the ground wire 17 by a resistor 34.

A conductor 35 and a variable resistor 36 form a positive feedback path for feeding energy from the anode 25 to the control grid 13. A variable capacitor 37 is connected across the resistor 36 to neutralize the interelectrode capacitance of the triode 12. A negative feedback path from the anode 25 to the cathode 15 is formed by a conductor 38, a triode 39 and a frequency sensitive network 44. The triode 39 comprises an anode 41, a control grid 42 and a cathode 43. The frequency sensitive network 44 comprises a resistor 45 and a resistor

46 connected in series with each other and between the conductor 38 and the control grid 42, a variable capacitor 47 which has one end connected to the junction of the resistor 45 and the conductor 38, a variable capacitor 48 which has one end connected to the junction of the resistors 45 and 46, and a variable capacitor 49 which has one end connected to the junction of the resistor 46 and the control grid 42. The other ends of the variable capacitors 47, 48 and 49 are connected together and to one end of a resistor 51 which has its other end connected to the ground wire 17. The cathode 43 is directly connected to the cathode 15 and is connected to the ground wire 17 through the resistor 18.

The local oscillator comprises a first triode 61 which contains an anode 62, a control grid 63 and a cathode 64, and a second triode 65 which contains an anode 66, a control grid 67 and a cathode 68. The control grid 63 and the cathode 64 are connected to a ground wire 69 by resistors 71 and 72 respectively. The anode 62 receives energy from a battery 73 through an anode load resistor 74 and is connected through a capacitor 75 to the control grid 67. The control grid 67 and the cathode 68 are connected to the ground wire 69 by resistors 76 and 77 respectively. The anode 66 receives energy from the battery 73 through an anode load resistor 78 is connected to a control grid 79 of the pentode mixer 33. The control grid 79 is connected to the ground wire 69 through a resistor 82.

A conductor 83 and a variable resistor 84 form a positive feedback path for feeding energy from the anode 66 to the control grid 63, and a variable capacitor 85 is connected across the resistor 84 to neutralize the interelectrode capacitance of the triode 61. A negative feedback path from the anode 66 to the cathode 64 is formed by a conductor 86, a frequency sensitive network 92 and a triode 87. The triode 87 comprises an anode 88, a control grid 89 and a cathode 91. The frequency sensitive network 92 comprises resistors 93 and 94 connected in series with each other and between the conductor 86 and the control grid 89, a fixed capacitor 98 having one end connected to one end of a variable capacitor 95 and the other end connected to the juction of the conductor 86 and the resistor 93, a fixed capacitor 99 having one end connected to the junction of the resistors 93 and 94 and the other end connected to one end of a variable capacitor 96, and a fixed capacitor 100 having one end connected to the junction of the resistor 94 and the control grid 89 and the other end connected to one end of a variable capacitor 97. The other ends of the variable capacitors 95, 96, and 97 are connected to one end of a resistor 101 which has its other end connected to the ground wire 69. The cathode 91 is directly connected to the cathode 64 and is connected to the ground wire 69 by the resistor 72. The variable capacitors 47, 48 and 49 of the amplifier and the variable capacitors 95, 96 and 97 of the oscillator are ganged together to be varied simultaneously.

In operation, the terminals 11 are connected to an antenna or other source of radio frequency energy. The received signals of all frequencies are amplified by the triode 12 and the triode 24, and a portion of the output voltage from the triode 24 is fed back through the variable resistor 36 to the control grid 13 in phase with the incoming signal. The variable resistor 36 is adjusted so that the amplitude of the positive feedback voltage is insufficient to cause the circuit to oscillate. A portion of the output voltage from the triode 24 is fed back to the control grid 42 to control the conduction through the triode 39, and as the conduction through the triode 39 varies, the voltage across the cathode resistor 18 also varies. The voltage of the cathode 15 varies in the same direction as the voltage on the control grid 13, decreasing the voltage differential between the cathode 15 and the control grid 13 and decreasing the gain of the amplifier.

The frequency sensitive network 44 acts as a band elimination filter which rejects signals within a narrow band of frequencies known as the rejection band. For frequencies which are within the rejection band, the impedances of the capacitors 47, 48 and 49 are such that the network 44 is balanced and produces no output. Thus, there is no negative feedback signal applied to the control grid 42 to reduce the gain of the amplifier for those signals which are in the rejection band of the network 44, and the amplifier is effectively tuned to the frequencies of the rejection band. The width of the rejection band is in part determined by the Q of the network 44, and the center frequency of the rejection band is determined by the values of the capacitors 47, 48 and 49. The network 44 and other similar networks are discussed in more detail in the article "Bridged Reactance-Resistance Networks, by G. R. Harris, in Proceedings of the I. R. E., vol. 37, No. 8, for August 1949, on pp. 882 through 887.

The local oscillator circuit operates similarly to the radio frequency amplifier circuit except that the positive feedback voltage is sufficient to cause the circuit to oscillate when the negative feedback signal is at a minimum. The amount of the positive feedback is determined by the variable resistor 84, and the circuit will oscillate with a frequency which is the central frequency of the rejection band of the frequency sensitive network 92. The fixed capacitors 98, 99 and 100 shift the frequency of the rejection band of the network 92 from the rejection band of the network 44 by a constant amount when the variable capacitors of both networks are of the same value. Therefore, when the signals from the radio frequency amplifier and from the local oscillator are combined in the mixer 33, there is produced in the mixer 33 a signal which is of a constant difference frequency for all settings of the variable capacitors of the networks 92 and 44. The difference frequency is the intermediate frequency of the radio receiver.

Double heterodyning may be used without introducing additional problems in tracking since all the variable capacitors 47, 48, 49, 95, 96 and 97 are identical and will track uniformly. The frequency responsive networks 44 and 92 are but an example of such networks which may be used with this invention. Other satisfactory circuits are the Wien bridge, the bridged-T and the twin-T such as are disclosed in "Vacuum Tube Amplifiers," edited by G. E. Valley and H. Wallman, Radiation Lab. Series, vol. 18, published by McGraw-Hill, in 1948, p. 384, et seq.

The circuits of this invention are of utility in superheterodyne radio receivers where ruggedness and wide reception bands are desired. Since no inductors are used in the variable tuning circuits of this invention, the tuned frequency is proportional to the first power of the reactance of the tuning elements rather than to the square root of the reactance as is true in circuits using both capacitors and inductors. This allows a receiver to be tuned over a much larger portion of the radio spectrum without the necessity for range-changing switches and additional circuitry. In addition, tracking among the component circuits of this invention is linear and uniform, producing more accurate tuning and requiring fewer adjustments.

Obviously many modifications and variations of the present invention are possible in the light of the above teachings. It is therefore to be understood that within the scope of the appended claims the invention may be practiced otherwise than as specifically described.

What is claimed is:

1. Heterodyning apparatus comprising the combination of a radio frequency amplifier and a local oscillator, said radio frequency amplifier and said oscillator each comprising a frequency sensitive network consisting only of resistors and capacitors for tuning; and a mixer circuit, the outputs of said amplifier and said oscillator being connected to said mixer circuit.

2. Heterodyning apparatus comprising a radio frequency amplifier having an input and an output, said amplifier comprising a negative feedback circuit connected from said output to said input to reduce the gain of said amplifier, a first frequency sensitive network consisting only of resistors and capacitors connected in said negative feedback circuit, said first network balancing out the negative feedback signal over a narrow band of frequencies, an oscillator comprising a positive feedback amplifier having a positive feedback circuit to cause said positive feedback amplifier to oscillate, said positive feedback amplifier comprising a second frequency sensitive network consisting only of resistors and capacitors for tuning said oscillator, a mixer circuit, and means for connecting the outputs of said amplifier and said oscillator to said mixer circuit.

3. Heterodyning apparatus comprising a radio frequency tuned amplifier containing a first frequency sensitive network consisting only of resistors and capacitors; a local oscillator circuit containing a first positive feedback circuit for feeding back sufficient energy to cause said oscillator circuit to oscillate, a first negative feedback circuit for tuning said oscillator, said first negative feedback circuit containing a second frequency sensitive network which consists only of resistors and capacitors, said first negative feedback circuit reducing the effect of said first positive feedback circuit, said second frequency sensitive network reducing the effect of said first negative feedback circuit for signals of a first preselected band of frequencies; and a mixer circuit, the outputs of said amplifier and said oscillator being connected to said mixer circuit.

4. The heterodyning apparatus described in claim 3 wherein said radio frequency amplifier comprises a second negative feedback circuit for reducing the gain of said amplifier, said first frequency sensitive network being connected to said second negative feedback circuit to reduce the effect of said second negative feedback circuit for signals of a preselected band of frequencies.

5. The heterodyning apparatus described in claim 4 wherein at least a portion of said capacitors of said first and said second frequency sensitive networks are variable, and means for mechanically connecting said variable capacitors together whereby they may be varied simultaneously.

6. In a superheterodyne radio receiver, a radio frequency amplifier circuit and an oscillator circuit, each circuit including a positive feedback path having a tunable frequency-determining network consisting only of resistance means and variable capacitance means, said networks being substantially identical and differing only in that the variable capacitance means in one of said circuits includes an additional fixed capacitance component for determining and maintaining the frequency difference between said circuits when they are tuned in assembly, and means for simultaneously tuning said circuits.

7. The radio receiver according to claim 6 wherein said circuits are two staged, including an output stage having an anode and an input stage having a cathode, with the negative feedback path from the anode through the frequency-determining network being electron coupled to the cathode through a cathode follower, whereby the selectivity is improved.

8. Heterodyning apparatus comprising a radio frequency amplifier having an input and an output, said amplifier including a negative feedback circuit having a tunable frequency-determining network consisting only of resistance means and variable capacitance means, and a positive feedback circuit separate from the negative feedback circuit, a radio frequency oscillator having an output and including an amplifier having a positive feedback circuit adjustable to cause the amplifier to oscillate, and a separate negative feedback circuit having a tunable frequency-determining network consisting only of resistance means and variable capacitance means, the variable components of both of said capacitance means having substantially identical values and at least one of said capacitance means having a fixed component whereby a tracking tunable system for two frequencies is provided, a mixer circuit, and means coupling the outputs of said amplifier and said oscillator to the mixer circuit.

References Cited in the file of this patent

UNITED STATES PATENTS

| | | |
|---|---|---|
| 2,128,556 | Clay | Aug. 30, 1938 |
| 2,439,245 | Dunn | Apr. 6, 1948 |
| 2,619,534 | Payne | Nov. 25, 1952 |
| 2,629,025 | Roberts | Feb. 17, 1953 |

UNITED STATES PATENT OFFICE

CERTIFICATE OF CORRECTION

Patent No. 2,783,373 February 26, 1957

Conrad J. Fowler

It is hereby certified that error appears in the printed specification of the above numbered patent requiring correction and that the said Letters Patent should read as corrected below.

Column 2, line 25, after "78" insert -- and --; line 42, for "juction" read -- junction --; column 3, line 72, for "compirsing" read -- comprising --.

Signed and sealed this 7th day of May 1957.

(SEAL)
Attest:

KARL H. AXLINE
Attesting Officer

ROBERT C. WATSON
Commissioner of Patents